(12) United States Patent
Nakamura et al.

(10) Patent No.: US 7,464,221 B2
(45) Date of Patent: Dec. 9, 2008

(54) STORAGE SYSTEM, STORAGE DEVICE, AND CONTROL METHOD THEREOF

(75) Inventors: Shuji Nakamura, Kanagawa (JP); Kazuhisa Fujimoto, Tokyo (JP); Akira Fujibayashi, Kanagawa (JP)

(73) Assignee: Hitachi, Ltd., Tokyo (JP)

( * ) Notice: Subject to any disclaimer, the term of this patent is extended or adjusted under 35 U.S.C. 154(b) by 114 days.

(21) Appl. No.: 11/247,161

(22) Filed: Oct. 12, 2005

(65) Prior Publication Data

US 2007/0050571 A1 Mar. 1, 2007

(30) Foreign Application Priority Data

Sep. 1, 2005 (JP) ............................. 2005-252989

(51) Int. Cl.
*G06F 13/00* (2006.01)
*G06F 12/14* (2006.01)

(52) U.S. Cl. .................... 711/113; 711/154; 711/163

(58) Field of Classification Search ................ 711/103, 711/100, 118, 135, 111, 112, 113, 154
See application file for complete search history.

(56) References Cited

U.S. PATENT DOCUMENTS

2005/0172074 A1* 8/2005 Sinclair ..................... 711/114

FOREIGN PATENT DOCUMENTS

JP 06-324815 11/1994

OTHER PUBLICATIONS

"Reducing Energy Consumption of Disk Storage Using Power-Aware Cache Management" by Zhu, et al.
European Patent Search to corresponding EP 06 250 654.8 dated Nov. 21, 2007.

* cited by examiner

*Primary Examiner*—Tuan V. Thai
(74) *Attorney, Agent, or Firm*—Mattingly, Stanger, Malur & Brundidge, P.C.

(57) ABSTRACT

A storage system including a storage device 1 which includes: media 50 for storing data from a host computer 2; a medium controller 14 for controlling the media; a plurality of channel controllers 11 for connecting to the host computer 2 through a channel; and a cache memory 13 for temporarily storing data from the host computer 2, wherein the media 50 have a restriction on a number of writing times. The storage device 1 includes a bus 123 for directly transferring data from the medium controller 14 to the channel controller 11.

3 Claims, 17 Drawing Sheets

FIG.10A
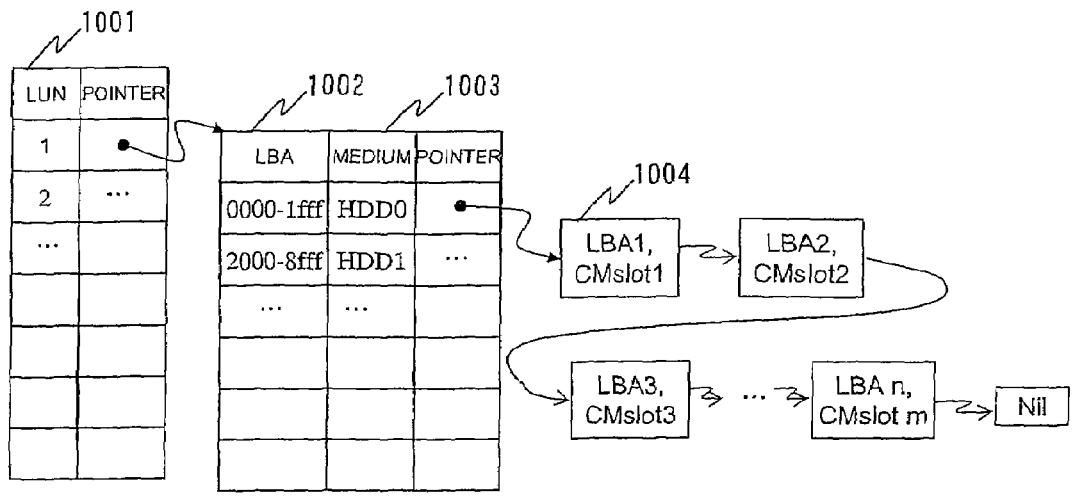
FIG.10B
1713:
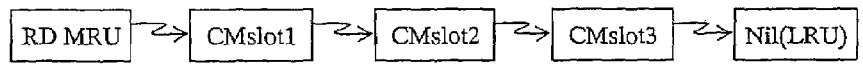
1714:
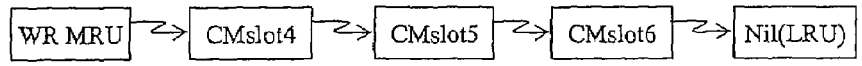

FIG.10C
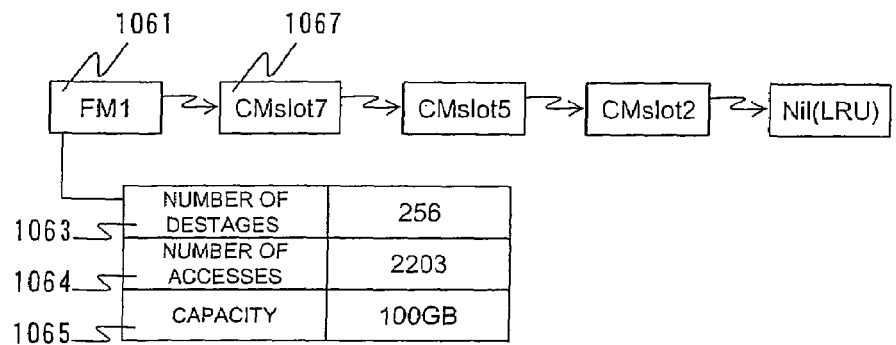
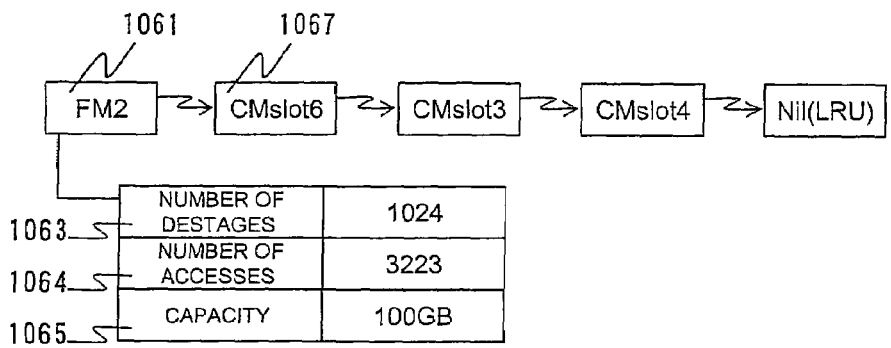
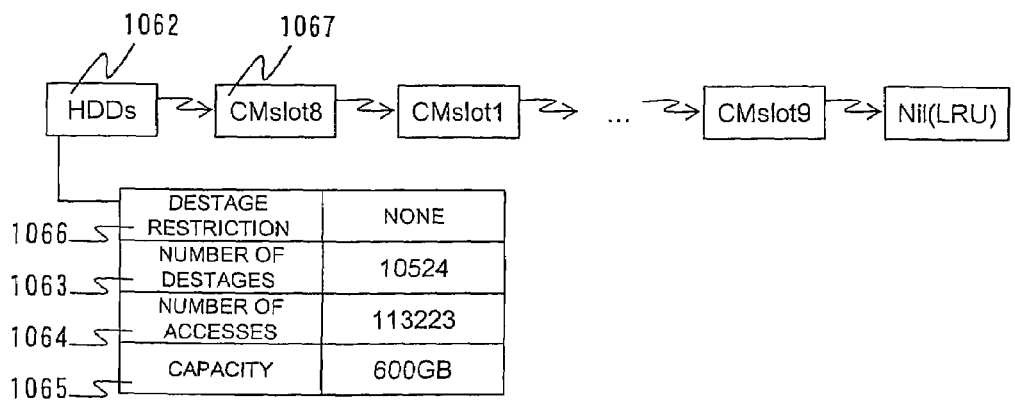

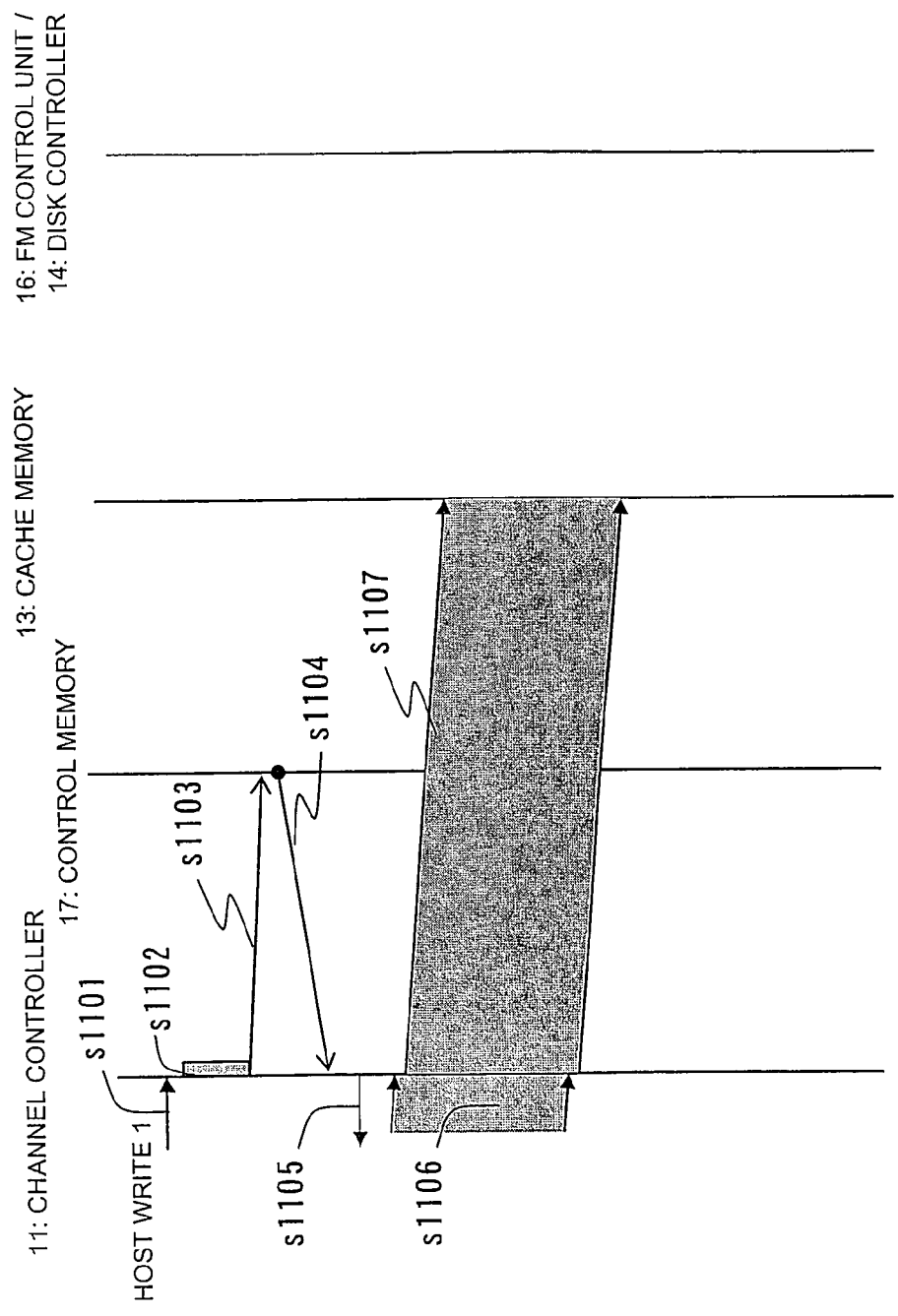

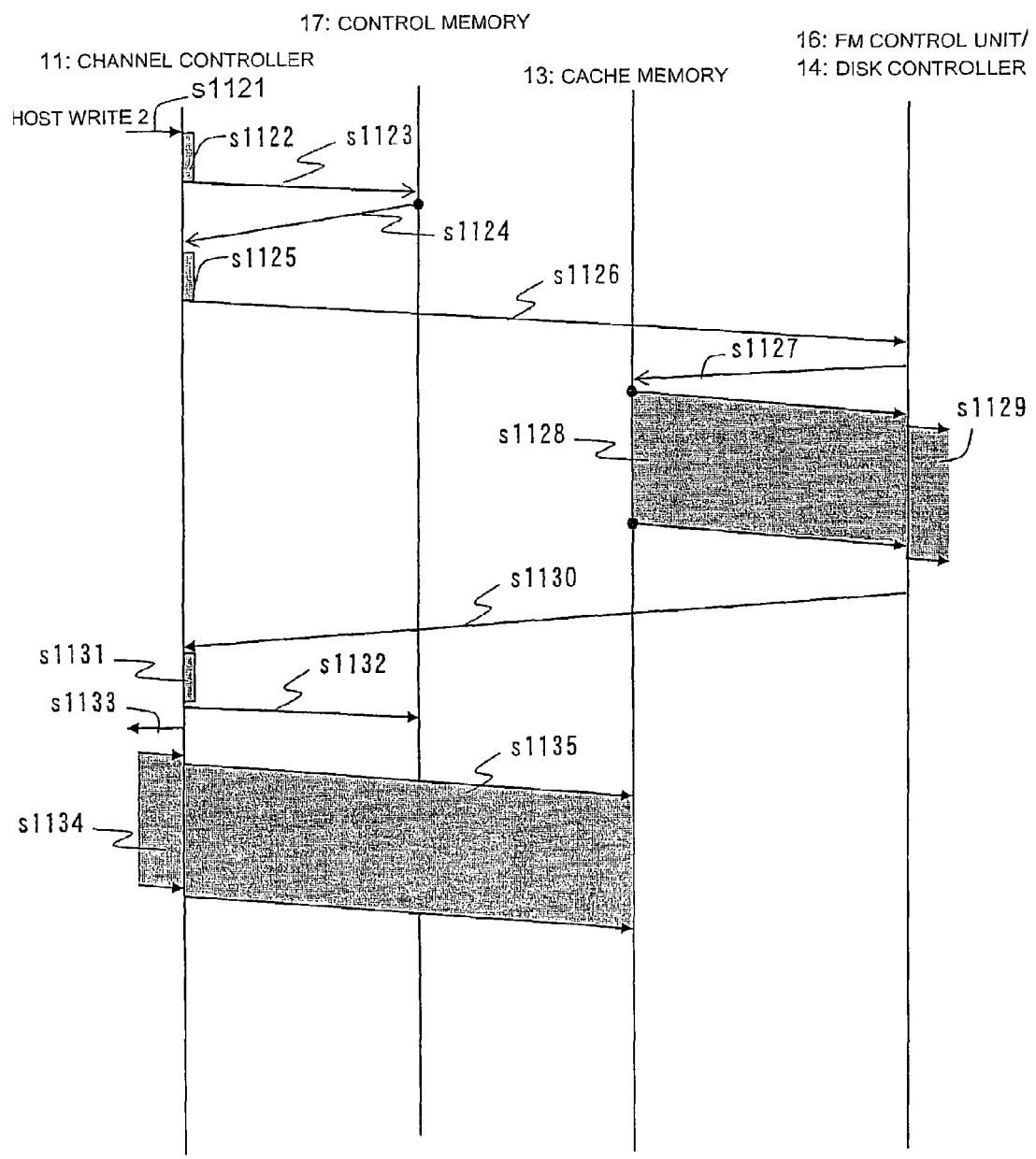

STORAGE SYSTEM, STORAGE DEVICE, AND CONTROL METHOD THEREOF

The present application is based on and claims priority of Japanese patent applications No. 2005-252989 filed on Sep. 1, 2005, the entire contents of which are hereby incorporated by reference.

BACKGROUND OF THE INVENTION

1. Field of the Invention

The present invention relates to a storage device and the control method thereof.

2. Description of the Related Art

In recent years, the reduction of the total cost of ownership (TCO) of a storage system becomes increasingly important in information business sites such as a data center. On the other hand, demand for recording data reliably for a long period of time is increasing. As an example of this fact, the document data of financial institutions, medical institutions, etc., are required to be stored without being erased by law. Under these circumstances, there is much demand for highly reliable storage systems having a large capacity. However, in general, in a large-scale storage system using hard-disk drives (in the following, referred to as "HDDs"), the amount of power consumption increases in proportion to the storage capacity. That is to say, the possession of a storage system with a large capacity means an increase in the total cost of ownership including electricity charges. In view of such situations, a technique for reducing the power consumption of HDDs by a cache management algorithm has been proposed (Nonpatent document; ZHU, Q., DAVID, F., ZHOU, Y., DEVARAJ, C., AND CAO, P., "Reducing Energy Consumption of Disk Storage Using Power-Aware Cache Management". InProc. of the 10th Intl. Symp. on High Performance Computer Architecture (HPCA-10) (February 2004)). Also, the problem is not limited to the electricity charges. In general, the floor area for installation increases as the capacity of a storage system increases. This also increases the total cost of ownership.

Incidentally, a flash memory attracts attention as a nonvolatile medium in recent years. A flash memory commonly consumes less than one several-tenth of power when compared with an HDD, and can be read at a high speed. Also, a flash memory is small sized unlike an HDD having a mechanically driven part.

However, a flash memory has a restriction on the number of writing times because of the physical constitution of a cell for holding information. Against such a restriction, the number of writing times of a flash memory has been improved by a technique called wear leveling, in which the number of writing times to each cell is controlled to be averaged by having correspondence between an address to be shown to the upper apparatus and a cell position. In this regard, in the following, an element for holding information is simply called a "flash memory", and a device including a mechanism for performing the above-described wear leveling, protocol processing for the upper apparatus, etc., is called a "flash memory device". Although some improvements have been made against the restriction on the number of writing times as a flash memory device by such a technique, there still exists a restriction on the number of writing times of a flash memory device. Also, in addition to that, there is a drawback in that the throughput of a flash memory becomes similar to an HDD when an operation called erase becomes necessary at the time of writing to a flash memory.

As a technique for constituting a storage system using such a flash memory, there is, for example, Japanese Unexamined Patent Application Publication No. 6-324815. In this patent document, a technique in which frequently-accessed parity data is stored in a semiconductor memory such as a flash memory in a RAID configuration, etc., in order to improve performance of a storage system is described. However, means for preventing a restriction on the number of writing times as a storage system has not been disclosed. Also, one RAID group is constructed by mixing an HDD and a flash memory, that is to say, one virtual device is constituted, and thus a virtual device is not controlled in consideration of the characteristics of individual media.

SUMMARY OF THE INVENTION

Under these circumstances, it is desirable to provide a storage system which is low in power consumption, has a small installation area, and is capable of constructing a large-scale system having a large capacity.

Also, it is desirable to provide a high system performance in accordance with the medium for storing data.

Moreover, it is also desirable to improve reliability and availability as a storage system. For a medium having a restriction of the number of writing times, it is necessary to alleviate the restriction as a storage system.

In the present invention, a storage system includes a plurality of channel controllers connecting to a host computer through channels and a cache memory containing a plurality of volatile memories for temporarily storing data from the host computer. The storage system includes a plurality of first media having a restriction of the number of writing times and a plurality of first medium controllers for controlling the first media, and stores data from the host computer to the first media.

That is to say, according to the present invention, there is provided a storage system including a storage controller including: one medium or more for storing data from a host computer; a medium controller for controlling the medium; a channel controller for connecting to the host computer through a channel; and a cache memory including a volatile memory for temporarily storing data from the host computer, wherein the media at least partially includes a first medium having a restriction on a number of writing times.

In the storage system of the present invention, the power consumption is low, the installation area is small, and it is possible to construct a large-scale system. Also, it is possible to provide a high system performance in accordance with the medium for storing data. Also, there is an advantage in that the number of writing times to each medium is reduced, and thus it is possible to increase the reliability and the availability of the storage system even for the medium having a restriction on the number of writing times.

BRIEF DESCRIPTION OF THE DRAWINGS

FIG. 10A is a block diagram illustrating details of read-cache directory information 1711 and write-cache directory information 1172;

FIG. 10B is a block diagram illustrating details of known access-sequence lists 1713 and 1714;

FIG. 10C is a block diagram illustrating details of access-sequence lists 1713 and 1714 for performing preferable cache control;

FIG. 11A is a diagram illustrating the processing flow when a write request comes from the host computer 2 and there is already the data of the address in the cache memory 13;

FIG. 11B is a diagram illustrating the processing flow when a write request comes from the host computer 2 and there is not the data of the address in the cache memory 13 or there is already no empty slot;

DESCRIPTION OF THE PREFERRED EMBODIMENTS

A description will be given of a best mode of embodiment for carrying out the present invention.

In the following, a description will be given of a storage system, a storage device, and the control method thereof according to embodiments of the present invention based on the drawings.

First Embodiment

Figure 1:
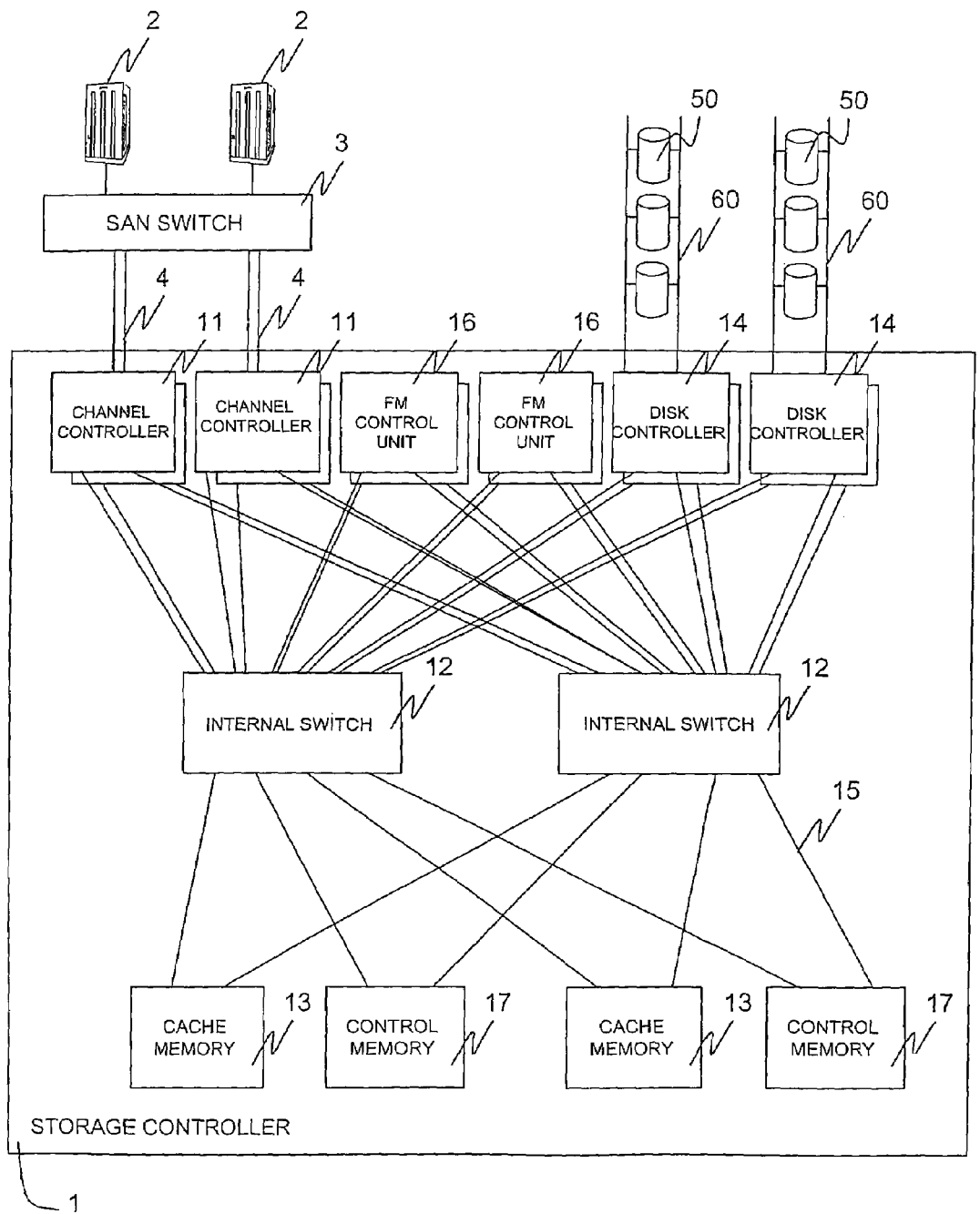
FIG. 1 is a block diagram of a configuration of a storage system according to a first embodiment.

A description will be given of a first embodiment. FIG. 1 is a block diagram of a configuration of a storage system according to the first embodiment of the present invention. The storage system includes a storage controller 1, hard disk drives (HDDs) 50, and a flash memory device (in the figure, an example of an FM control unit 16 internally including flash memory devices is shown). The storage controller 1 is connected to a host computer 2 via a channel 4 through a SAN (Storage Area Network) including a SAN switch 3. Also, the storage controller 1 is connected to a plurality of HDDs 50 which are media storing data through a disk-side channel 60. The storage controller 1 includes a plurality of channel controllers 11, a plurality of cache memories 13, a control memory 17, a plurality of disk controllers 14, a plurality of FM control units 16, and internal switches 12 connecting these through an internal bus 15. The channel controller 11 receives an input/output request from the host computer 2 through the channel 4, interprets the request type (for example, a read request and a write request) of this input/output request, the target address, etc., and performs the processing as described in FIG. 7 and below. The cache memories temporarily stores data to be stored in an HDD and a flash memory and data to be returned to the host computer 2. The control memory 17 stores the directory information of the cache memories 13 and the configuration information of the storage system. The disk controllers 14 control the HDDs 50 through a disk-side channel 60 based on a request of the channel controller 11, etc., and fetches and stores the data requested from the host computer 2. At this time, the disk controllers 14 may perform RAID control on the HDDs 50 in order to improve the reliability, availability, and performance of the storage system. The FM control units 16 perform the control of flash memories or the flash memory devices. The FM control units 16 fetch and store the data requested from the host computer 2 to the flash memories or the flash memory device based on a request of the channel controllers 11, etc. At this time, the FM control units 16 may perform RAID control on the flash memory devices in order to improve the reliability, availability, and performance of the storage system. In this regard, in the present embodiment, the storage system is connected to the HDDs 50. However, the storage system may have a configuration without having the HDDs 50 and the disk controllers 14. Also, the information stored in the control memory 17 may be physically located in the same memory as the cache memories 13.

Figure 2:
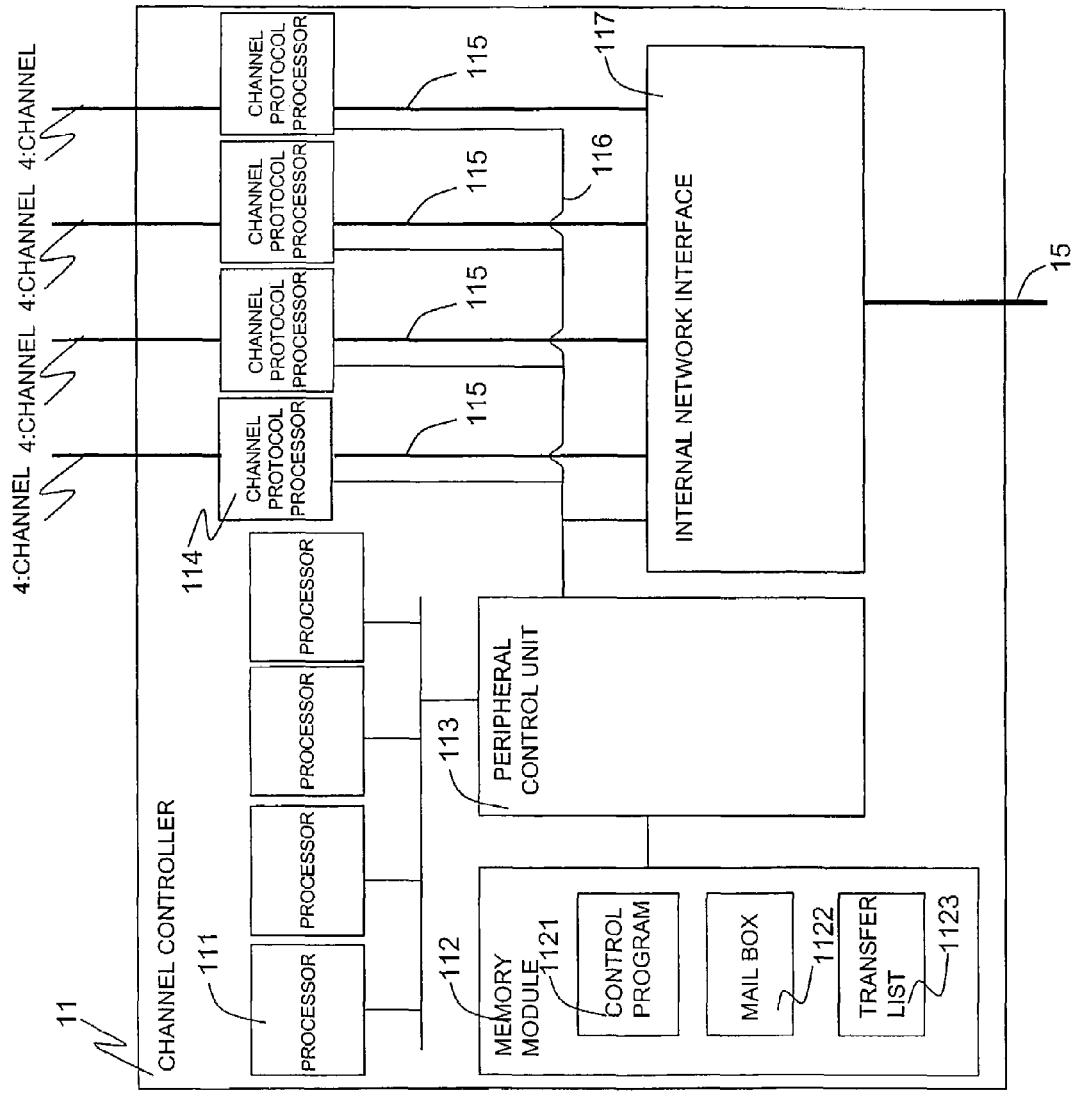
FIG. 2 is a block diagram of a detailed configuration of a channel controller 11.

FIG. 2 is a block diagram of the detailed configuration of the channel controller 11. The channel controller 11 includes a plurality of processors 111, a memory module 112, a peripheral control unit 113, a plurality of channel protocol processors 114, and an internal network interface 117. The processors 111 are connected to the peripheral control unit 113 through a bus, etc. The peripheral control unit 113 is connected to the memory module 112 and controls the memory module. Also, the peripheral control unit 113 is connected to the channel protocol processors 114 and the internal network interface 117 through a control system bus 115. The peripheral control unit 113 receives a packet from the connected processors 111, the channel protocol processors 114, and the internal network interface 117. If the destination address indicated by the packet falls on the memory module 112, the peripheral control unit 113 performs the processing, and returns data if necessary. Also, if the destination address falls outside, the peripheral control unit 113 performs appropriate forwarding. Also, the peripheral control unit 113 has a mail box 1131 for the other processors 111 to perform communication with the processor 111 connected to the peripheral control unit 113. The processors 111 access the memory module 112 through the peripheral control unit 113, and performs processing based on the control program 1121 stored in the memory module 112. Also, the memory module 112 stores a transfer list 1123 for the channel protocol processors 114 performing DMA (Direct Memory Access). The channel protocol processor 114 performs protocol control on the channel 4, and converts into a protocol which can be processed in the storage system 1. When the channel protocol processor 114 receives an input/output request from the host computer 2 through the channel 4, the channel protocol processor 114 notifies the host computer number, the LUN (Logical Unit Number), the access destination address of the input/output request, etc., to the processor 111. The processor 111 accesses directory information 1323 based on the notification. If there is an address to which the input/output data is to be stored or the input/output data, the processor 111 creates the transfer list 1123 in the memory module 112, and causes the channel protocol processor 114 to perform transfer based on the list. When the data requested for reading by the host computer 2 is not in the cache memory 13, if the data is stored in the HDD 50, the processor 111 instructs the disk controller 14 to store the requested data stored in the HDD 50 into the cache memory 13 (this operation is called "staging"), and then causes to transfer the data by the transfer list 1123. If the data is stored in the flash memory, the address of the flash memory is set in the transfer list. The transfer list is an address list in the cache memory 13 or the flash memory. If the input/output request is writing, the data from the host computer is written into the address described in the list through the internal network interface 117 connected the data-transfer system bus 115. Also, if the request is reading, the data is similarly read from the address described in the list, and that data is returned to the host computer. The details of these operations are described using FIG. 7 and subsequent figures. The internal network interface 117 is a part to be an interface when communication is performed between the inside of the channel controller 11 and the inside of the other storage systems 1 through an internal bus 15.

In this regard, the disk controller 14 has a substantially similar structure to the channel controller 11. However, the contents of the control program 1121 is different and the channel protocol processor 114 performs communication with the HDD 50 (the protocol of the channel 4 and that of the disk-side channel 60 may be different. However, the processing is the same as the channel protocol processors 114 in the channel controller 11 in the sense that protocol processing of the disk-side channel 60 is performed and the conversion is performed in order to be processed in the storage system 1). The processor 111 writes the data in the cache memory 13 into a hard disk drive 50 by a request from the channel controller 11 or at regular time intervals. Also, if the data requested from the host computer is not in the cache memory 13, the processor 111 receives an instruction from the channel controller 11, reads data from the HDD 50, and writes the data into the cache memory 13. At these times, the processor 111 accesses the directory information stored in the control memory 17, and investigates the address of the cache memory from or to which the requested data by the host computer 2 is read or stored. When there is not the requested data in the cache memory 13, if there is no empty area in the cache memory 13, the existent data is stored into the HDD 50 for making an empty area in order to store the requested data (this operation is called destage). In the operation of the HDD 50, the disk controller 14 controls the HDD 50 through the disk-side channel 60. At this time, in order to improve the availability and the performance as the entire HDDs 50, the disk controller 14 performs the RAID control on the HDD 50 group.

Figure 3:
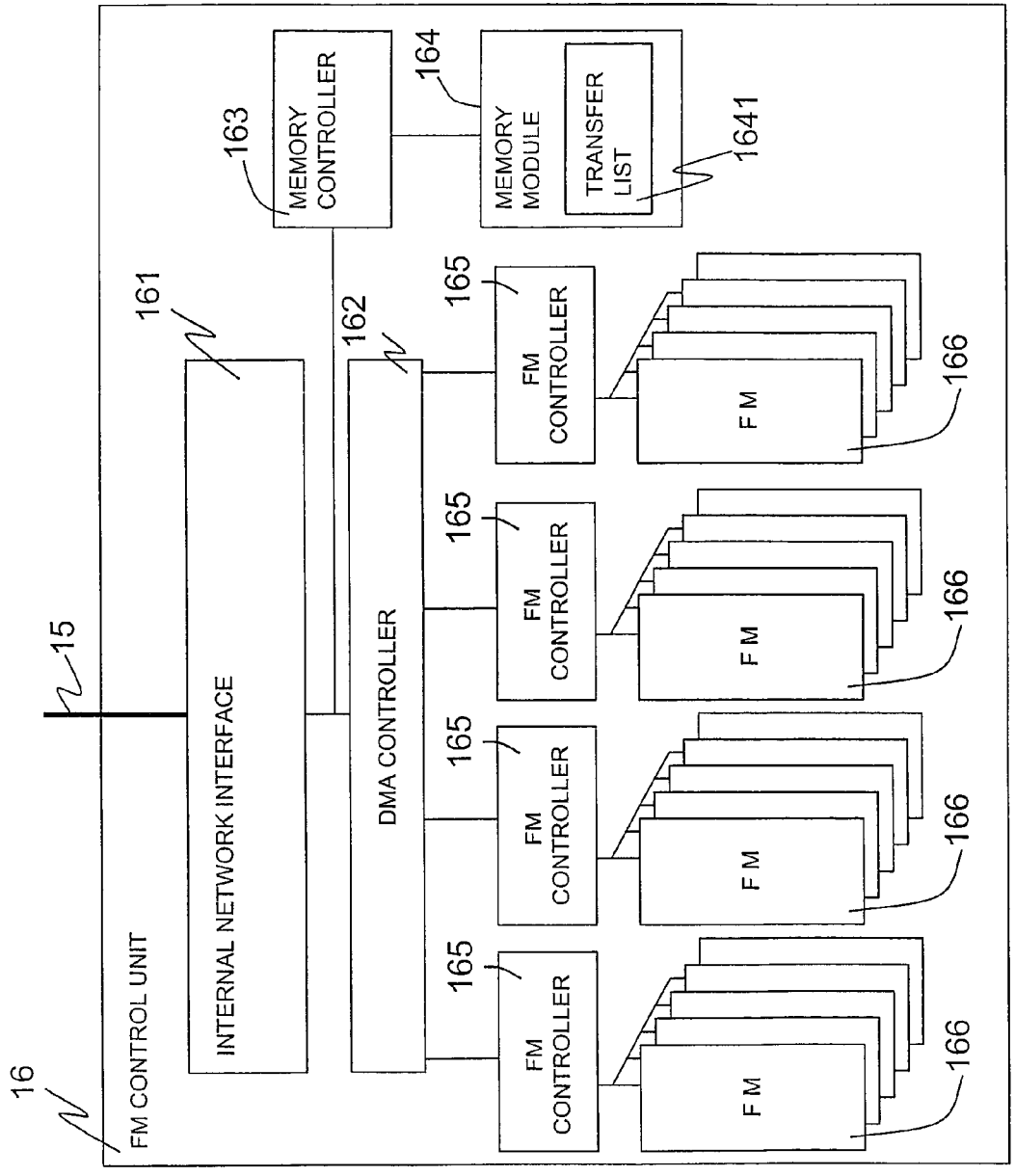
FIG. 3 is a block diagram of a detailed configuration of an FM control unit 16.

FIG. 3 is a block diagram of the detailed configuration of the FM control unit 16, in which flash memories are integrated. The FM control unit 16 includes an internal network interface 161, a DMA controller 162, a memory module 164 which is a volatile memory, a memory controller 163 for controlling the memory module, flash memories 166 (FM in the figure), FM controllers 165 which control the flash memories. The internal network interface 161 is a part to be an interface between the inside of the FM control unit 16 and the inside of the other storage controller 1 through the internal bus 15. The DMA controller 162 in the FM control unit 16 performs data transfer from the cache memory 13 to the flash memory 166 using the transfer list 1641 set by the processor 111 of the channel controller 11 in the case of creating an empty area in the cache memory when processing a write request from the host computer 2. The FM controller 165 controls the flash memory 166 to exchange data by a read request made from the channel controller 11 through the internal network and a write request of the DMA controller 162. In FIG. 3, as an embodiment of the flash memory 166, it is possible to directly dispose the memory on a printed-circuit board. At this time, parts such as the connectors, the FM protocol processors in FIG. 4, and FM-side channels become unnecessary, and thus it is possible to achieve more compact storage system. Also, the wear leveling for each of the flash memories 166 may be performed by the FM controller 165.

Figure 4:
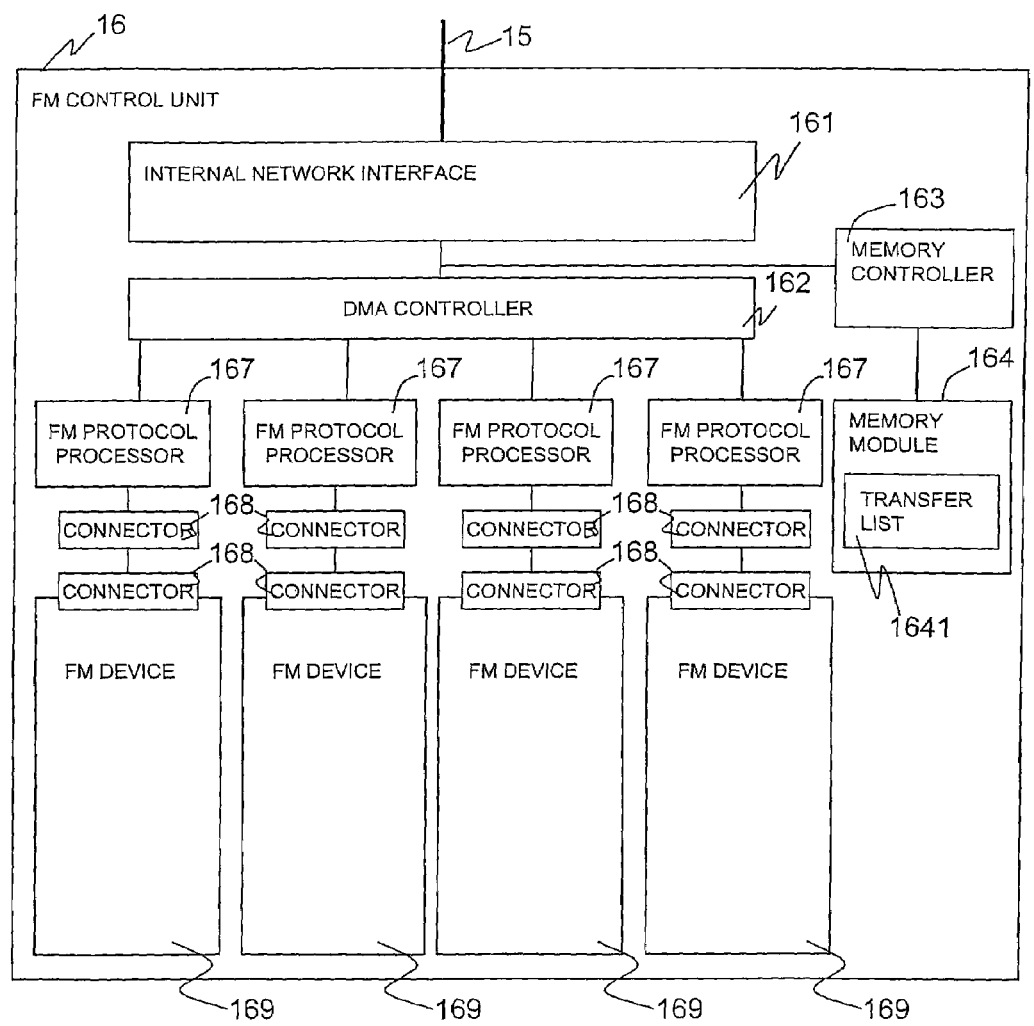
FIG. 4 is a block diagram of another detailed configuration of the FM control unit 16.

FIG. 4 is a block diagram of another detailed configuration of the FM control unit 16. Here, a flash memory device 169 is used as a memory element. The flash memory device 169 is disposed separately. The flash memory device 169 is connected to the FM control unit 16 through a connector 168, and thus the flash memory device is made detachable. Accordingly, when the flash memory device 169 has broken down, it can be replaced (in order to do this, the transfer list 1641 should be set such that the processor 111 of the channel controller 11 has a redundant configuration among the flash memory device 169 in advance). Also, it is possible to replace the flash memory device 169 itself by a flash memory device having a large capacity. The reliability and performance of this flash memory device 169 have been improved by employing a technique, such as wear leveling, etc., inside the device. Data is exchanged with the outside using a special protocol. Thus, a FM protocol processor 167 converts the data into a format that can be processed in the storage controller 1.

Figure 5:
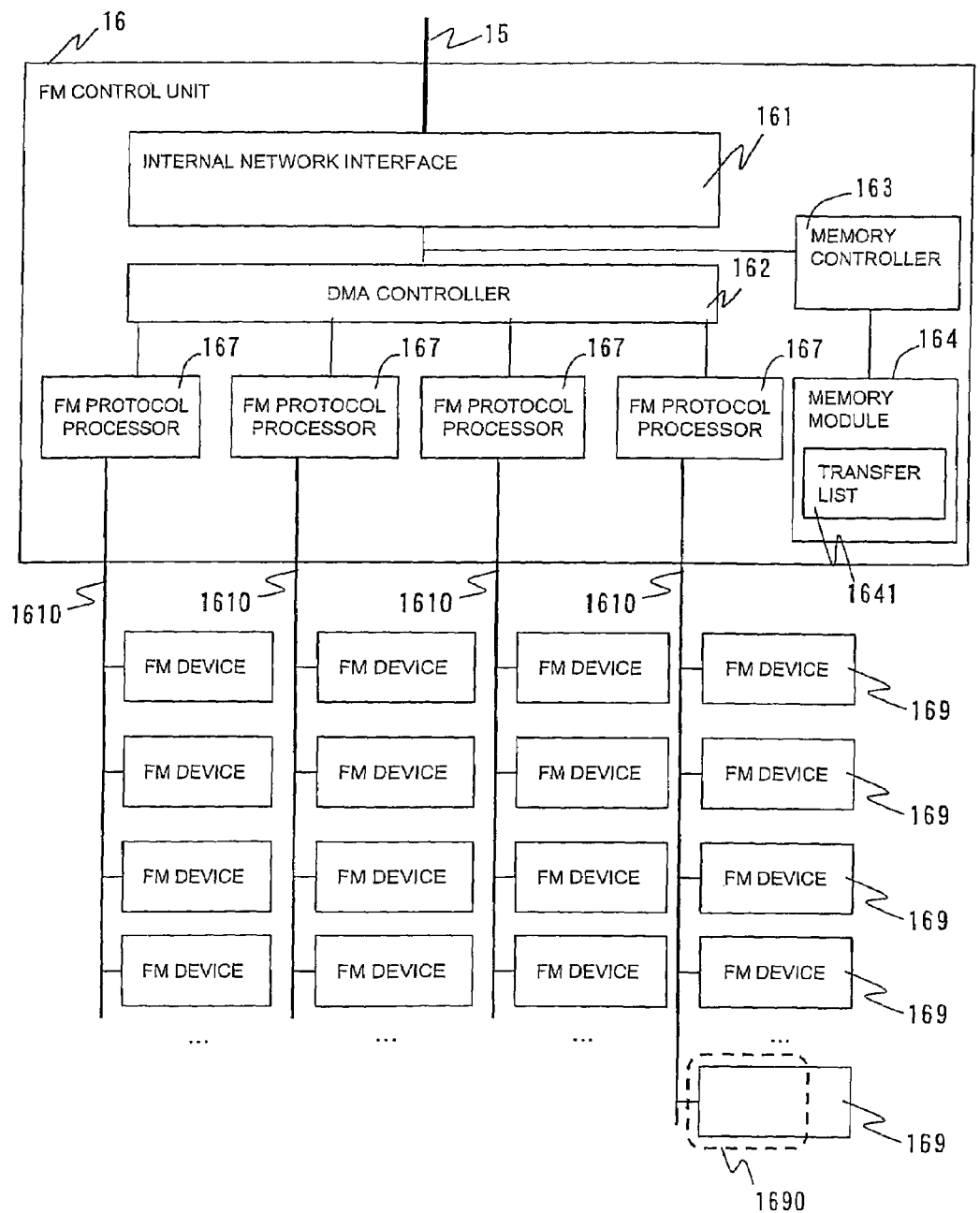
FIG. 5 is a block diagram of another detailed configuration of the FM control unit 16.

FIG. 5 is a block diagram of another detailed configuration of the FM control unit 16. Here, the flash memory devices 169 are connected through FM-side channels 1610. By using this configuration, a larger number of flash memory devices 169 can be connected in order to achieve a storage system with a large capacity in addition to the features of the FM control unit 16 described in FIG. 4. Also, part of the area of the flash memory devices 169 may be used as an urgent destage area 1690 described below.

Figure 6:
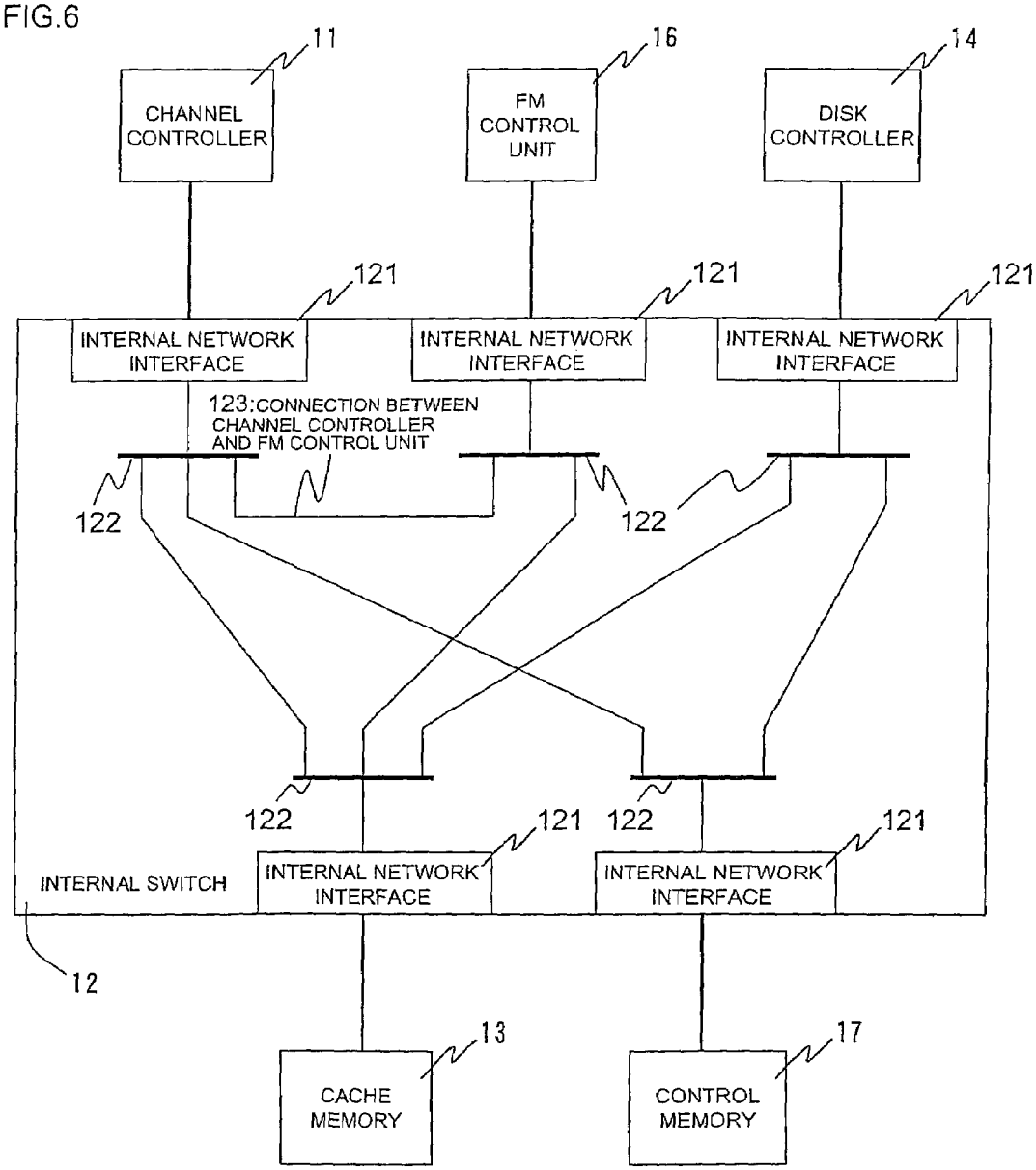
FIG. 6 is a block diagram of a detailed configuration of an internal switch 12.

FIG. 6 is a block diagram of a detailed configuration of the internal switch 12. The internal switch 12 includes an internal network interface 121 and a plurality of selectors 122. The selector 122 analyzes the destination of the request sent from each part such as the internal channel controller 11 of the storage controller 1, and transfers the request to the internal network interface 121 controlling the internal bus 15 connected to the request destination. At that time, each of the selectors performs the contention of the internal network interface 121 of the request-transfer destination. The internal switch 12 makes it possible for the channel controller 11 to directly exchange data with the cache-memory 13, the control memory 17, and the FM control unit 16. The FM control unit 16 can exchange data with the channel controller 11, the cache memory 13, and the control memory 17. Also, the disk controller 14 can directly exchange data with the cache memory 13 and the control memory 17. The difference on the connection of the FM control unit 16 and that of the disk controller 14 is that the internal switch 12 has a connection 123 between the channel controller and the FM control unit, and thus the FM control unit 16 can directly exchange data with the channel controller 11.

Figure 7:
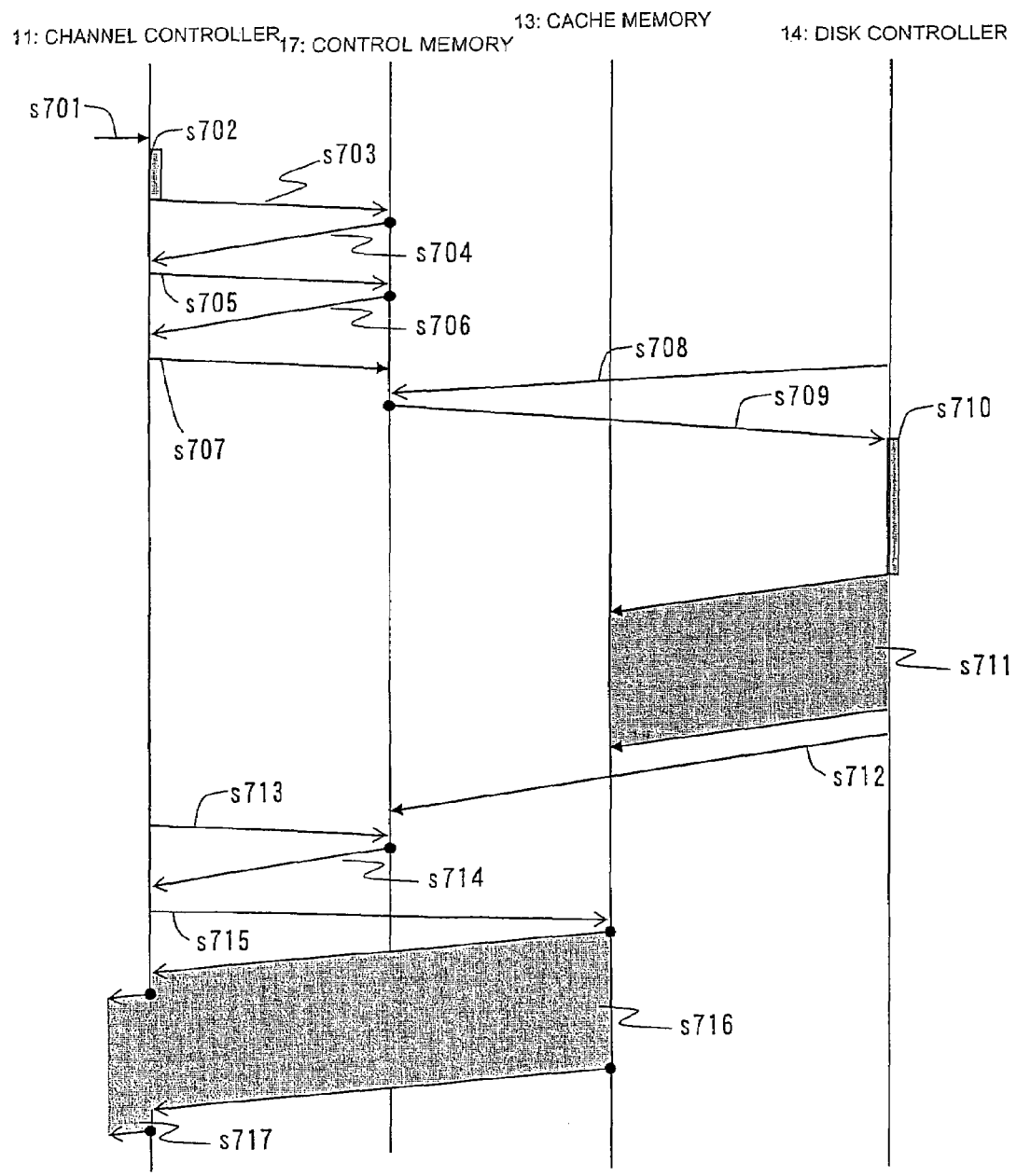
FIG. 7 is a diagram illustrating the processing flow when a read request comes from a host computer 2 to an HDD 50 area.

FIG. 7 is a diagram illustrating the processing flow when a read request comes from the host computer 2 to an HDD 50 area. The channel controller 11 receives a read request from the host computer 2 through the channel 4 (step s701). The processor 111 of the channel controller 11 analyzes the received request and obtains an LUN and a target logical block address. Here, the processor 111 knows that the data is in an area to be stored in the HDD 50 (step s702). Furthermore, the processor 111 of the channel controller 11 accesses the directory information of the write cache area and the read cache area, which is stored in the control memory 17, and checks whether there is the data stored in the cache memory 13 (steps s703 and s704. In the figure, accessed once. However, sometimes accessed a plurality of times in reality. This is the same in the following). If there is already the data in cache memory 13, the processor 111 responds to the host computer 2 by the processing of step s715 and after. Here, the data is assumed not to be in the cache memory 13. In this case, the disk controller is caused to transfer the data to the cache memory 13 (staging). However, is there is no empty area in the cache memory 13, the cache area for storing the data needs to be created before the staging. In steps s705 and s706, a determination operation is performed on which area is used for the empty area. After the area is obtained, a staging request is made to the disk controller 14 by writing a message into a communication area 173 of the control memory 17 (step s707). The disk controller 14 knows that there is a request from the channel controller 11 by reading the communication area 173 of the control memory 17 periodically or at each completion of a series of processing (steps s708 and s709). In this regard, the reason why the channel controller 11 and the disk controller 14 operate in cooperation in such a manner is that the time required for obtaining data from the HDD 50 is indefinite and long as compared with the other processing time. Thus, it is possible to perform the other request processing, etc., in the background in this manner. The disk controller 14, which has recognized a staging request, controls the HDD 50 the disk-side channel 60 to obtain that data (step s710). When the data from the HDD 50 is obtained, the disk controller 14 writes that data into the areas obtained in steps S705 and s706 (step s711. Staging). Also, the disk controller 14 notifies the completion of the staging to the channel controller 11 using the communication area 173 (step s712). The channel controller 11 reads the communication area 173 in the same manner as the disk controller 14, and thus knows that there is a message of the completion of the staging (steps s713 and s714). After that, the processor 111 of the channel controller 11 sets the transfer list 1123 (may have set the list immediately after the staging request in advance), and instructs to transfer the list. The channel protocol processors 114 reads the data from the cache memory 13 and transfers the data to the host computer 2 (steps s715, s716 and s717). The above description is the processing flow of the reading of the data stored in the HDD 50. The response time of the HDD 50 is indefinite and short, and thus it becomes necessary to exchange data through the cache memory 13.

Figure 8:
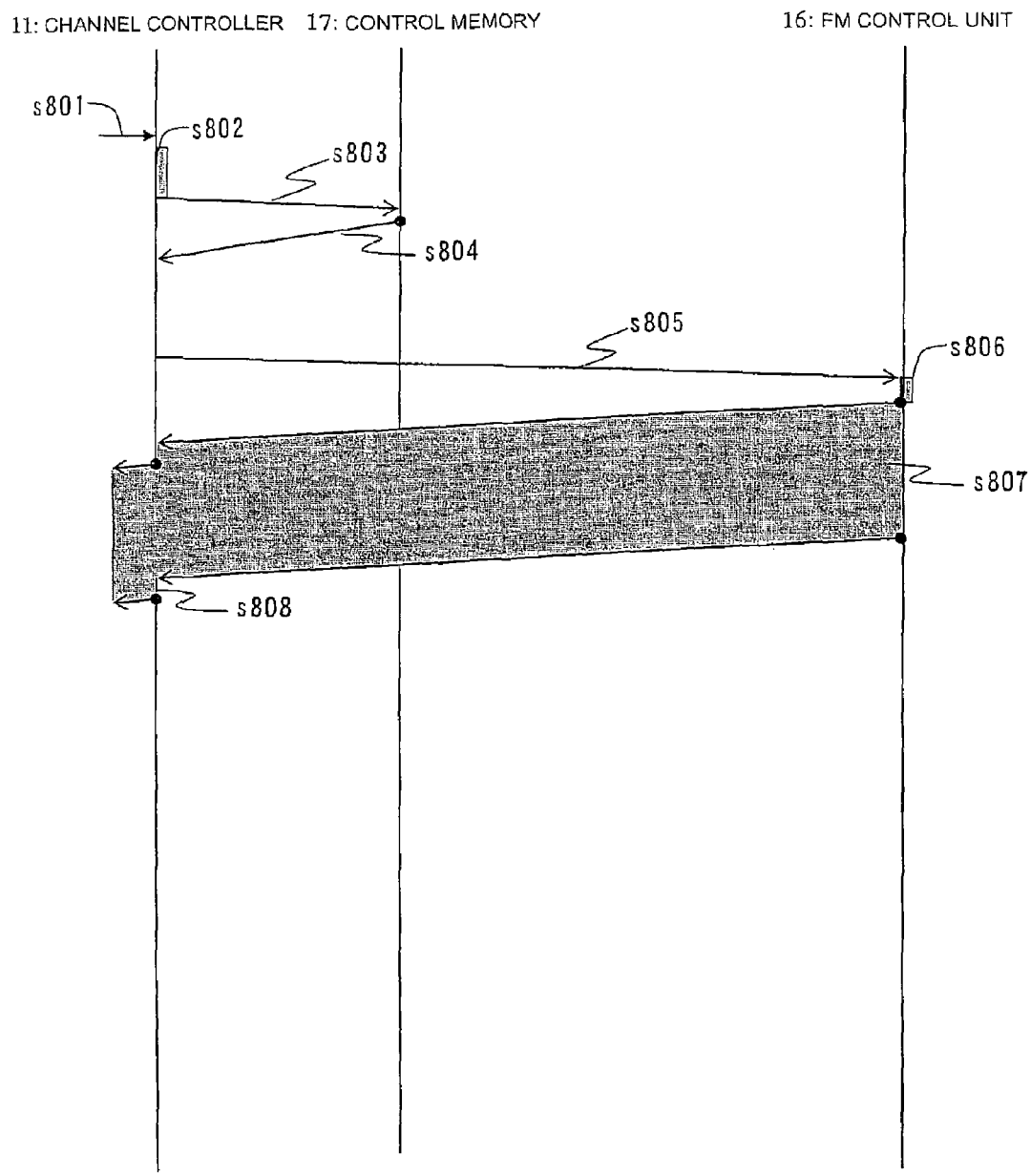
FIG. 8 is a diagram illustrating the processing flow when a read request comes from a host computer 2 to a flash memory area.

FIG. 8 is a diagram illustrating the processing flow when a read request is made from the host computer 2 to a flash memory area. The channel controller 11 receives a read request from the host computer 2 through the channel 4 (step s801). The processor 111 of the channel controller 11 analyzes the received request and obtains an LUN and a target logical block address. Here, the processor 111 knows that the data is in an area to be stored in the flash memory (step s802). Furthermore, the processor 111 of the channel controller 11 accesses the directory information of the write cache area and the read cache area, which is stored in the control memory 17, and checks whether there is the data stored in a write-cache area 132 of the cache memory 13 (steps s803 and s804). Unlike the case of FIG. 7, only the investigation on the write cache area 132 is necessary. Here, the data is assumed not to be in the cache memory 13. The processor 111 of the channel controller 11 sets the transfer list 1123, and instructs the channel protocol processor 114 to transfer the list. The channel protocol processors 114 requests data from the FM control unit 16 through the connection 123 between the channel controller and the FM control unit of the internal switch 12 (step s805). The FM control unit 16 fetches data from the flash memory 166 or the flash memory device 169 (step s806), and returns the data to the channel controller 11 (step s807). The channel protocol processor transfers the data obtained in this manner to the host computer 2 (step s808). The above description is the read procedure of the data stored in the flash memory 166 or the flash memory device 169. The reading speed of a flash memory is constant and high (step s806), and thus it becomes possible to exchange data without the cache memory 13. Also, since data is directly transferred, cache processing is not performed for reading, and thus the processing for the investigation (steps s703 and s704) of a read cache area 131 and the processing for obtaining the cache area (steps s705 and s706) become unnecessary. Therefore, it becomes possible to read from a medium at a high speed and also to perform the attached processing at a higher speed. Also, for a flash memory, the read cache area 131 is unnecessary. Thus, there is an advantage in that it becomes possible to reduce the capacity of the control memory 17 which stores the cache memory 13 and the read-cache directory information 1711.

Subsequently, a description will be given of a method for controlling a cache memory 13 preferable for the flash memory 166 or the flash memory device 169. Before that, a description will be given of the information regarding the processing flow and the cache memory 13 when a write request is made from the host computer 2.

FIG. 11A is a diagram illustrating the processing flow when a write request is made from the host computer 2 and there is already the data of the address in the cache memory 13. For a write request, data is temporarily stored in the cache memory 13 both when the target is an HDD 50 area and when the target is an flash memory area. First, the channel controller 11 receives a write request from the host computer 2 through the channel 4 (step s1101). The processor 111 of the channel controller 11 analyzes the received request and obtains an LUN and a target logical block address (step s1102). Furthermore, the processor 111 of the channel controller 11 accesses the directory information of the write cache area and the read cache area, which is stored in the control memory 17, and checks whether there is the data stored in the cache memory 13 (steps s1103 and s1104. In this regard, if there is the data in the read cache area 131, the relevant slot is invalidated by the procedure described below and is added to new write-cache directory information 1712). Here, the data of the address is assumed to be already in the write cache area 132. In this case, the data is stored in the same cache-memory slot (control unit of a cache memory, which will be described below). The channel controller 11 sets the transfer list 1123 to store the data into the relevant slot while requesting the transmission of the data to the host computer 2 (step s1105). The channel protocol processor 114 receives data from the responded host computer 2 (step s1106), and stores the data into the cache memory 13 based on the transfer list 1123 (step s1107). In such a case, even if the request is a write request to the flash memory, the data may not be written into the flash memory, and thus the number of writing times can be reduced. Accordingly, in the case of a write request, even the storage medium of the data is the flash memory 166 or the flash memory device 169, processing is performed using the cache memory 13 unlike the case of a read request.

Next, a description will be given of the processing flow of the case where a write request is made from the host computer 2, and there is not the data of the address in the cache memory 13 but there is no empty slot. The processing is the same as step s1104 in FIG. 11A as far as step s1124. However, in this figure, it is assumed that there is not the data of the address in the write cache area 132 and there is no empty slot. Thus, first, the existent data in the cache memory 13 is stored in the HDD 50 or the flash memory (destaging), and the area for storing the data from the host computer 2 this time is created. First, the data to be destaged is determined by an LRU (Least Recently Used) algorithm, etc (step s1125). When the data to be destaged is determined, the processor 111 of the channel controller 11 sets the transfer list 1641 having the description of the correspondence of the address in the cache memory 13 and the address of the flash memory 166 or the flash memory device 169 in the FM control unit 16 (step s1127). In this regard, if the target is the HDD 50, a destage request is performed by transmitting a message to the disk controller 14 using the communication area 173 similarly as in FIG. 7. Subsequently, the DMA controller 162 of the FM control unit 16 reads the data (steps s1127 and s1128) from the cache memory 13, and writes the data into the flash memory 166 or the flash memory device 169 (step s1129) based on the transfer list 1641. When a series of processing is completed, the DMA controller 162 notifies the completion of the destage to the processor 111 of the channel controller 11 (step s1130). In order to store this data from the host computer 2 into the slot that has been destaged, the processor 111 updates the directory information (steps s1131 and s1132), and sets the transfer list 1123 so as to store the data into the relevant slot while making a transmission request of the data to the host computer 2 (step s1133). The channel protocol processor 114 of the channel controller 11 receives data from the responded host computer 2 (step s1134), and stores the data into the cache memory 13 based on the transfer list 1123 (step s1135).

Figure 9:
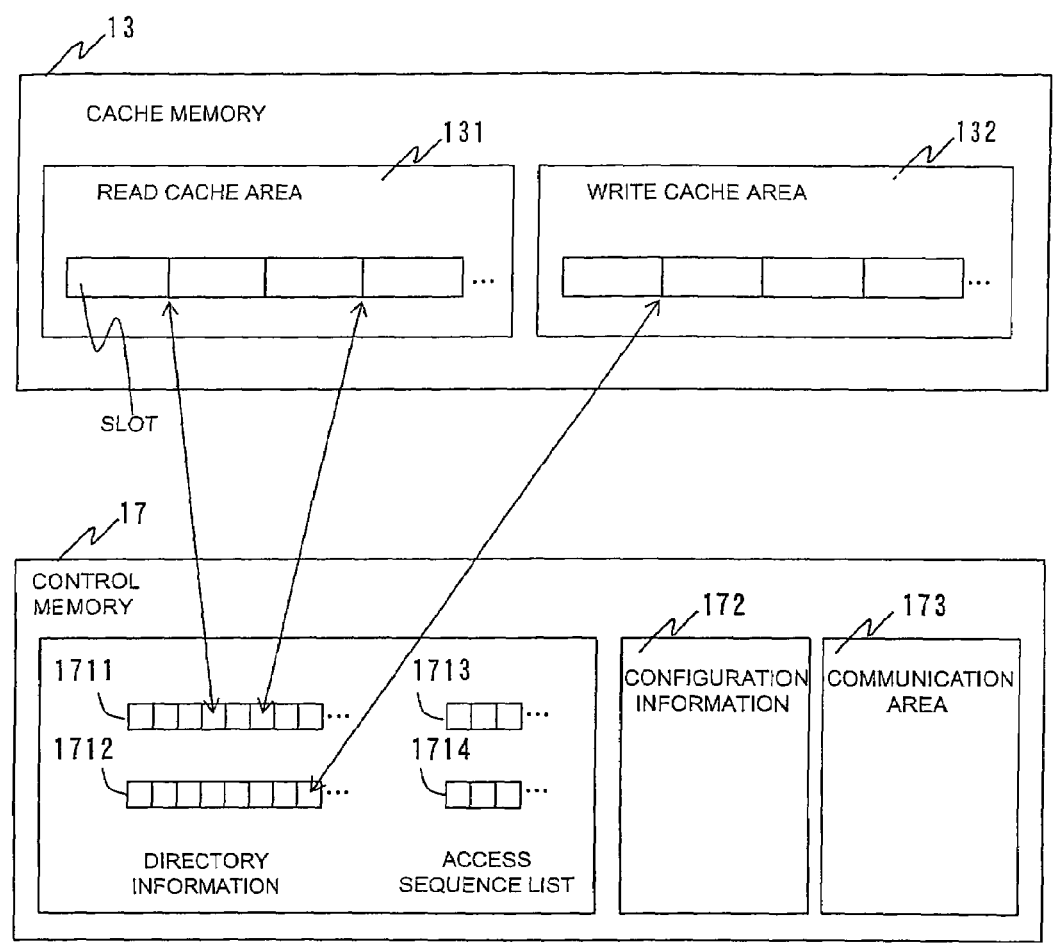
FIG. 9 is a block diagram illustrating detailed data stored in a cache memory 13 and a control memory 17.

Next, a description will be given of information on the cache memory 13 described so far. FIG. 9 is a block diagram illustrating detailed data stored in a cache memory 13 and control memory 17. The cache memory 13 has the read cache area 131 and the write cache area 132. The read cache area 131 temporarily stores the data requested to be read from the host computer 2. Thus, when a read request is received on the stored data from the host computer 2 again, the data of the read cache area 131 is returned without reading from the HDD 50 again, thereby the speed of processing as a storage system is improved. In the present embodiment, the read cache area 131 is provided because the read time from the HDD 50 is indefinite and low speed. However, the read cache area 131 is not used for the data stored in the flash memory. The write cache area 132 temporarily stores the data requested to be written from the host computer 2. If a write request is received on the same address of the stored data, that data in the write cache area 132 is overwritten. For the HDD 50 area, data is temporarily written into the high-speed cache memory 13, and thus the improvement of the performance can be expected. Also, data is overwritten in the cache memory 13, and thus it is possible to reduce the number of writing times into the flash memory. It is therefore possible to improve the reliability and the availability of the storage system. In this regard, the unit for controlling these is called a slot here.

Next, a description will be given of the control memory 17. The control memory 17 stores directory information 171, configuration information 172, and a communication area 173. The configuration information 172 is information on the storage system. For example, that information is information on how many channel controllers 11 are provided, what LU (Logical Unit) is provided to the channel 4 connected to each of the controllers, which HDD 50 or flash memory device 166 is used by the LU for storing data, or in what form the LU is virtually provided. The communication area 173 is the area for the channel controller 11 and the disk controller 14 to write or read a message with each other in order to perform cooperative operations. Also, the directory information 171 is information indicating which data is stored in the cache memory 13. The directory information 171 has read-cache directory information 1711 and write-cache directory information 1712 indicating that address data from the host computer 2, indicated by which LUN or logical block address (LBA), etc., is stored in which part of the cache memory 13, and read and write access-sequence lists 1713 and 1714 which are used for the bases for determining which existent data is invalidated in order to store new data into the cache memory 13.

In this regard, the cache memory 13 and the control memory 17 include a high-speed volatile memory having no restriction of writing times. However, the memories include a function of backing up a battery capable of holding the contents for a certain period of time in case of power failure, etc. Moreover, in case of a still larger-scale power failure which is considered to be longer than the time period capable of holding the battery, all the data temporarily stored in the cache memory 13 is written into a medium using the processing from steps s1125 to s1129 in FIG. 11B in order not to lose data in case that the backup battery is dead. Alternatively, the images of the cache memory 13 and the control memory 17 are directly written into an urgent destage area provided in the medium in advance without using this method, because the processing using steps s1125 to s1129 needs the calculation of the processor 111. This may be executed by setting the transfer list 1641 so that all the areas of the cache memory 13 and the control memory 17 are obtained or by providing the DMA controller 162 with a function of obtaining the images of the cache memory 13 and the control memory 17. In particular, a flash memory is a low-power-consumption device, and thus is suitable for a medium of the processing which must be executed in a limited time period and power of a backup battery. That is to say, a great advantage is obtained by providing the urgent destage area in the flash memory 166 or the flash memory device 169. For example, an urgent destage area 1690 is allocated to a part of the area of the flash memory device 169 in FIG. 5.

FIG. 10A is a block diagram illustrating details of the read-cache directory information 1711 and the write-cache directory information 1172. The directory information includes an LUN field 1001, an LBA field 1002, a medium field 1003 indicating the medium to which the data is finally stored, and the subsequent correspondence list 1004 between the host and the cache address, which stores in a list format the correspondence between the address (LBA) specified by the host computer 2 and the address of the cache memory 13 where the data is stored. When an investigation on whether there is the data requested by the host computer 2 in the cache memory 13 (corresponds to operations of steps s703 and s704 in FIG. 7 and steps s803 and s804 in FIG. 8, a search is made for the data having the same LUN as the received request from the LUN field 1001. Next, an investigation is conducted on whether the LBA field 1002 in the table indicated by the corresponding pointer matches the LBA of the received request. The LBA field 1002 indicates a range of LBA, and information on the data in the matching LBA range is stored in the correspondence list 1004 between the host and the cache address indicated by the pointer corresponding to that field. In the list 1004, a value of LBA (not in the range) the address (slot number) of the cache storing that data is described. If there is not a corresponding LBA in the correspondence list 1004 between the host and the cache address indicated, the cache memory 13 does not store the relevant data.

FIG. 10B is a block diagram illustrating details of known access-sequence lists 1713 and 1714. This is information indicating what number each which slot data is recently accessed. The slot stored in the beginning is the most recently accessed slot, and the slot stored in the last is the earliest accessed slot. The information corresponding to each of the read cache area 131 and the write cache area 132 is stored in a list structure. For example, when an access request is received from the host computer 2 for data not stored in the cache memory 13 and an empty slot is created in the cache memory 13, assuming that a common LRU algorithm is used, the earliest accessed slot, that is to say, the slot located at the last position of the list, is invalidated for creating a new empty slot in the cache. After that, new data is stored in that slot, and the slot is most recently accessed. Thus, that slot is placed at the beginning of the access-sequence lists 1713 or 1714. For the operation procedure of this list, first, the slot information placed at the last position is removed by a delete operation and that slot information is added to the beginning by an insert operation. In this regard, at this time, the cache directory information 1711 or 1172 is updated. The information indicating the data originally stored in that slot is removed from the correspondence list 1004 between the host and the cache address, and the data corresponding to a new LBA is added along with that slot number by the insert operation. Also, when a request is received from the host computer 2, but the data is already stored in the cache memory 13, only the access-sequence lists 1713 or 1714 is updated, and the cache directory information 1711 or 1172 is not updated.

When the access-sequence list of FIG. 10B shown above is used for the flash memory 166 or the flash memory device 169, the following problem occurs. Since the slot to be staged is determined by the access sequence, only a certain medium is sometimes destaged, that is to say, is written. For example, when a cache memory with three slots is provided, if a write request is made for the data having addresses A and B for FM1 and the data having addresses C and D for FM2 by a repeating pattern A, B, C, A, B, and D, the destaging is concentrated on FM2. In such a situation, the number of writing times into the medium reaches the limit number in a short time, and thus it might be difficult to provide reliability and availability satisfactorily as a storage system. In this regard, in the present embodiment, a description is given using an LRU algorithm. However, the same problem may occur when an algorithm other than the LRU, such as an access frequency, is used.

In the following, a description will be given of a method of controlling cache, which prevents such a problem. FIG. 10C is a block diagram illustrating details of known access-sequence lists 1713 and 1714 for performing preferable cache control. Unlike FIG. 10B, a list 1061 is provided for each medium (for each flash memory device 169) for a flash memory having a restriction of the number of writing times. For the HDD 50, the list may be provided for each HDD 50, or one list 1062 for all the HDDs 50. Furthermore, each list is provided with a table having a number-of-destage-times field 1063, a number-of-access-times field 1064, and a capacity field 1065. The number-of-destage-times field 1063 indicates the total number of destages performed on the medium. The number-of-access-times field 1064 indicates the number of accesses including reading and writing occurred on the medium area. This includes the number of times when there is data in the cache memory 13. Also, the capacity field 1065 indicates the capacity of the medium. The capacity field 1065 is used when it is necessary to consider that the frequency of writing data into one cell in the flash memory becomes lower as the capacity becomes larger even if the flash memory device 169 is destaged by the same frequency. Furthermore, each medium has a list. The contents of the list is almost the same as in the case of FIG. 10B. Assuming the use of the LRU algorithm, the list stores information indicating what number is which slot recently accessed. However, this information is only on the data to be stored in this medium. In this regard, the list on the HDD 50 has a destage restriction field 1066. If this field is "none", the cache control is performed differently on the flash memory and the HDD 50, and the medium type is recognized as an HDD in step s1201 in FIG. 12A described below. In this case, the write cache area 132 is divided into an HDD 50 area and a flash memory area in advance. When the cache memory is used more flexibly without such a division, this field is set to "existent", and the same cache control is performed as the flash memory. In this case, even the medium type is an HDD, the processing as a flash memory is selected in step s1201 in FIG. 12A. Also, the number-of-destage-times field 1063 may be reset to zero at regular intervals of time. When the reset is performed, the number-of-destage-times field 1063 for all the media is set to zero.

Figure 12A:
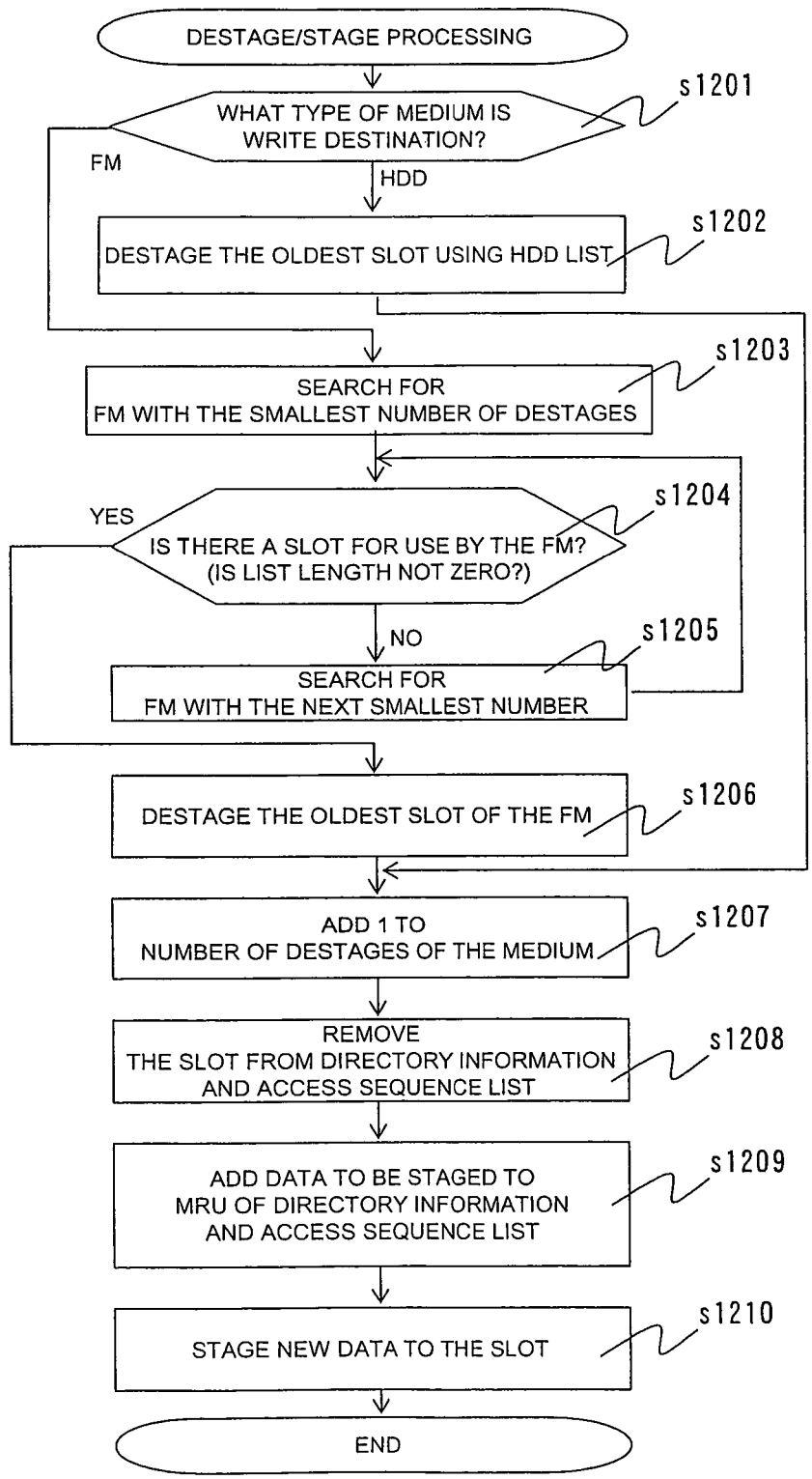
FIG. 12A is a diagram illustrating the processing for determining a slot to be destaged.

Next, a description will be given of processing for determining a slot to be destaged using the access-sequence lists 1713 and 1714 in FIG. 10C with reference to FIG. 12A. The processing is executed by the processor 111 of the channel controller 11, and corresponds to the processing after step s1125 in FIG. 11B, which is the processing after the destaging must be performed. First, a determination is performed on the medium type, that is to say, whether the write request received from the host computer 2 is to the HDD or to the flash memory (step s1201). This can be known using the medium field 1003 of the directory information. If the medium type is an HDD, the earliest accessed slot is searched using the access-sequence list 1062 of the HDD, a message for destaging the slot is sent, and the processing is moved to step s1207 (step s1202). If the medium type is a flash memory, or if it is an HDD and the destage restriction field 1066 is "existent", the number-of-destage-times field 1063 of each medium is compared, and a medium with the smallest number of destage times is searched (step s1203). An investigation is conducted on whether there is a used slot by checking the number of elements of the list of the medium (step s1204). If there is not a slot, a medium with the second smallest number of destage times is searched and the processing is moved to step s1204 again (step s1205). If there is a slot, the earliest accessed slot is searched using the access-sequence list 1061 of the HDD, and an instruction is given to destage that slot (step s1206). Next, one is added to the number-of-destage-times field 1063 (step s1207). Furthermore, that slot is removed from the directory information and access-sequence list (step s1208). Moreover, information on data to be staged is added to the latest position of the directory information and the access-sequence list (step s1209). After that, the data received this time is written into that slot (step s1210). In this regard, in step s1203, a medium with the smallest number of destage times is searched. However, as mentioned in the description of the capacity field 1065, if the number of writing times of the cell itself is considered, the number of destage times divided by the capacity may be used for the evaluation function.

Figure 12B:
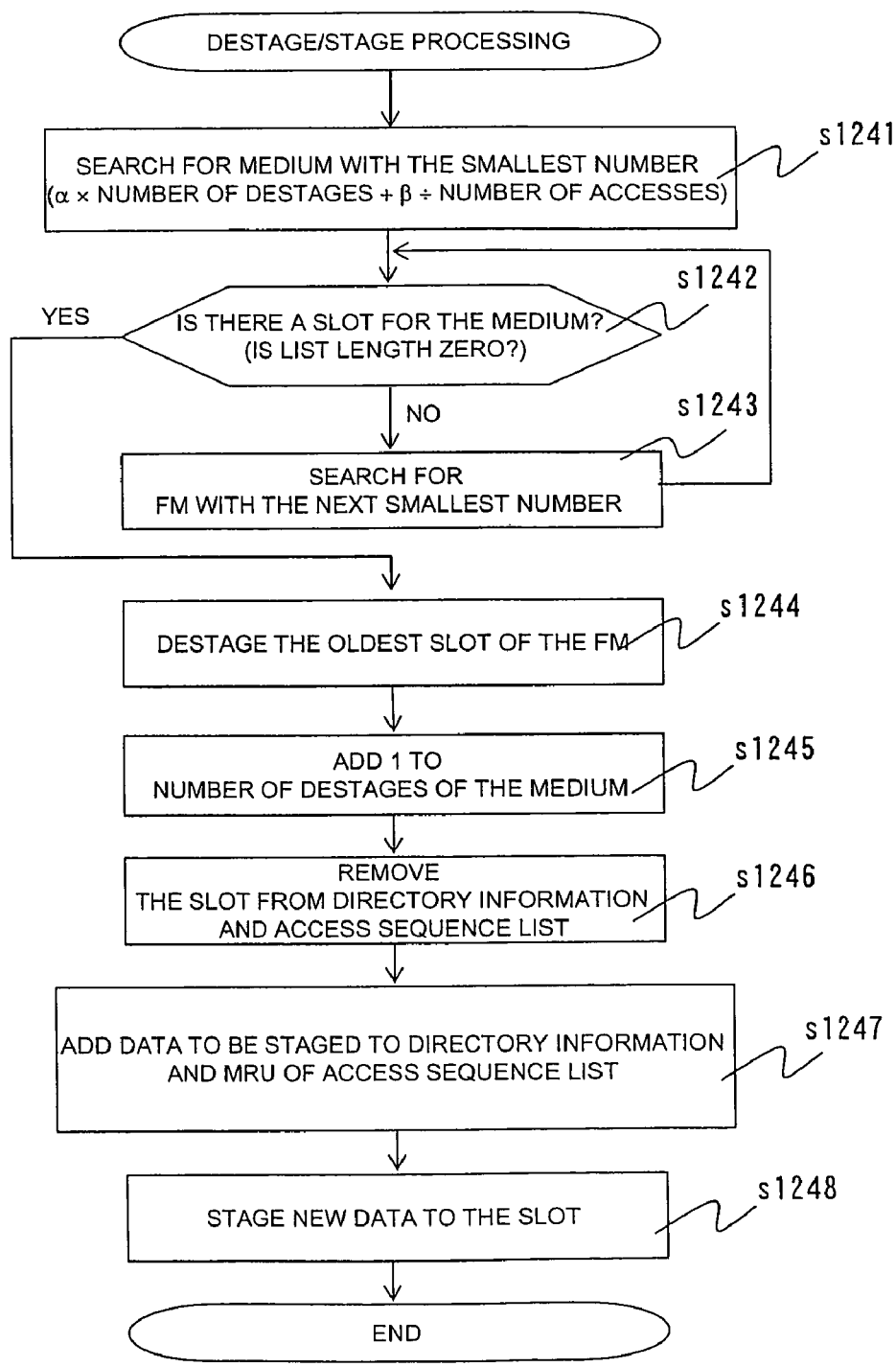
FIG. 12B is a diagram illustrating the processing for determining a slot in consideration of not only the number of stages but also the number of accesses.

Also, a description will be given of the same processing in consideration of not only the number of destage times but the number of access times using FIG. 12B. First, a search is made on the number-of-destage-times field 1063 and the number-of-access-times field 1064 of each medium. Assuming that ? and ? are constants, the product of ? and the number of destage times is added to the ? divided by the number of access times, and this sum is defined as an evaluation function. A medium having the smallest value of the evaluation function is searched (step s1241). By checking the number of elements in the list of the medium, an investigation is conducted on whether there is a slot in use (step s1242). If there is no slot, the medium having the next smallest value is searched and the processing moves to step s1242 again (step s1243). If there is a slot, the earliest accessed slot is searched using the access-sequence lists 1061 and 1062, and the slot is instructed to be destaged (step s1244). The subsequent processing is the same as step s1207 in FIG. 12A. When this processing is used, it is not necessary to separate a flash memory area and an HDD area. Also, it is possible to flexibly cope with a pattern in which performance improvement is possible using a cache memory, etc., such as the case where a lot of read requests are issued for the same data after a write request is issued when the medium is an HDD. In this regard, it is possible to select a medium in the sequence of an index.

Second Embodiment

Figure 13:
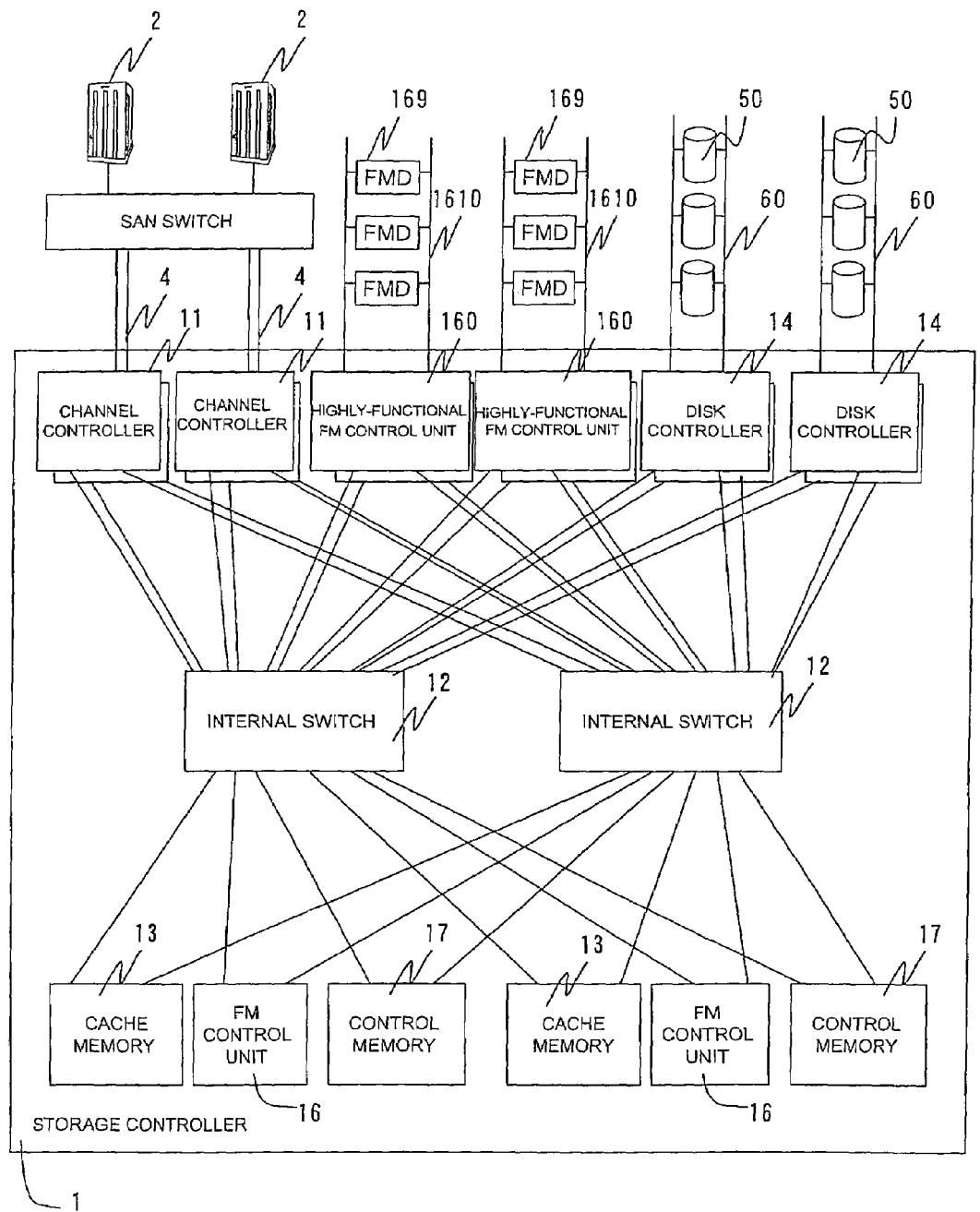
FIG. 13 is a block diagram of a storage system according to a second embodiment.

A description will be given of a second embodiment. FIG. 13 is a block diagram of a storage system according to the second embodiment of the present invention. In this embodiment, the FM control unit is implemented at the position equal to the cache memory 13 and the control memory 15. In general, the cache memory 13 and the control memory 15 may not be implemented at the position where the channel 4 and the disk-side channel 60 can be connected unlike the channel controller 11 and the disk controller 14. There is no restriction on the implementation, for example, there is no need for disposing the cache memory 13 and the control memory 15 at the front surface of the device for easy work of connecting to the channel 4, and there is no need for disposing near the HDD 50 by the restriction of the transmission path of the disk-side channel 60. Accordingly, it is possible to implement the memories more compactly by disposing the memories at this position. In this case, the form of the FM control unit 16 of FIG. 3 or FIG. 4 is preferable.

Figure 14:
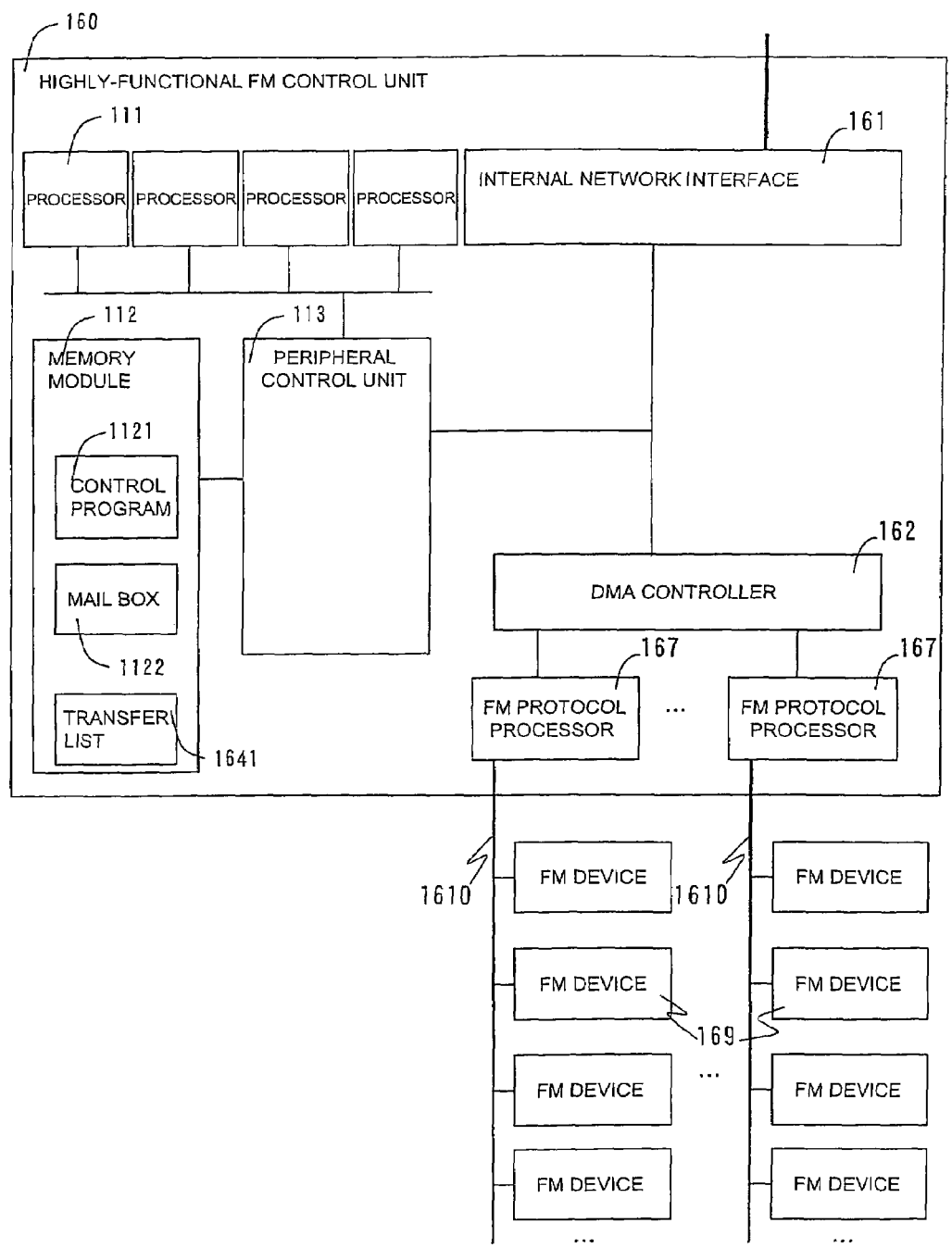
FIG. 14 is a block diagram of a highly-functional FM control unit 160.

Furthermore, FIG. 14 shows a block diagram of a highly-functional FM control unit 160, which is made more highly-functional than the FM control unit 16. Moreover, when a larger scale configuration is employed, it is preferred that this control part is used. Here, the FM control unit 160 has a plurality of processors 111 in the same manner as the channel controller 11, and a processing method is implemented by the control program 1121. Thus, it is possible to perform control for obtaining high reliability and availability and for improving management.

As described in the above embodiments, according to another first embodiment of the present invention, there is provided a storage system including the storage device including a bus for directly transferring data from a first medium controller controlling the first medium to the channel controller.

According to another second embodiment of the present invention, there is provided a storage system including the storage device including a bus for directly transferring data from the cache memory to a first medium controller controlling the first medium.

According to another third embodiment of the present invention, there is provided a storage system including the media including a first medium having a restriction on a number of writing times and a second medium having no restriction on the number of writing times.

According to another fourth embodiment of the present invention, there is provided a storage system including the media, wherein the second medium has a lower reading speed and greater power consumption than the first medium, but has a by far larger possible number of writing times than the first medium.

According to another fifth embodiment of the present invention, there is provided a storage system including a bus for transferring data stored in the second medium from a second medium controller controlling the second medium to a cache memory for temporarily storing the data.

According to another sixth embodiment of the present invention, there is provided a storage system in which the channel controller receives a read request from the host computer, and when target data of the read request is not stored in the cache memory but is stored in the first medium, the data is directly transferred to a first medium controller controlling the first medium.

According to another seventh embodiment of the present invention, there is provided a storage system in which the storage device selects data to be destaged so as to average the number of writing times on the first media.

According to another eighth embodiment of the present invention, there is provided a storage system in which the storage device records a number of destage times on each of the first media.

According to another ninth embodiment of the present invention, there is provided a storage system in which the storage device compares the number of destage times on each of the first media when selecting data to be destaged, and determines data to be destaged from data having a smaller number of destage times with priority.

According to another tenth embodiment of the present invention, there is provided a storage system in which the storage device records information on access time and frequency of data to be stored in each of the first media in relation to each of the first media.

According to another eleventh embodiment of the present invention, there is provided a storage system in which the storage device calculates an evaluation function based on a number of destages and access times on each of the first media, and determines data to be destaged from data having a smaller value of the evaluation function with priority.

According to another twelfth embodiment of the present invention, there is provided a storage system in which the storage device includes a battery for backing up a cache memory.

According to another thirteenth embodiment of the present invention, there is provided a storage system in which the first medium controller is a highly-functional medium controller for partially performing a function of the channel controller.

According to another fourteenth embodiment of the present invention, there is provided a storage device including: a medium controller for controlling a medium for storing data from a host computer; a channel controller for connecting to the host computer through a channel; and a cache memory including a volatile memory for temporarily storing data from the host computer, wherein the storage device includes a bus for directly transferring data from a first medium controller controlling the first medium having a restriction on a number of writing times to the channel controller.

According to another fifteenth embodiment of the present invention, there is provided a storage device including a bus for directly transferring data from the cache memory to a first medium controller controlling the first medium.

According to another sixteenth embodiment of the present invention, there is provided a storage device further including a bus for transferring data stored in the second medium from a second medium controller controlling the second medium having a read speed slower than that of the first medium, power consumption greater than that of the first medium, and a possible number of writing times by far greater than that of the first medium, to a cache memory for temporarily storing the data.

According to another seventeenth embodiment of the present invention, there is provided a storage device in which the channel controller receives a read request from the host computer, and when target data of the read request is not stored in the cache memory but stored in the first medium, the channel controller instructs the first medium controller for controlling the first medium to directly transfer the data.

According to another eighteenth embodiment of the present invention, there is provided a method of controlling a storage controller including a medium controller for controlling a medium for storing data from a host computer, a channel controller for connecting to the host computer through a channel, and a cache memory including a volatile memory for temporarily storing data from the host computer, the method including the steps of: receiving a read request from the host computer; and when target data of the read request is not stored in the cache memory but stored in the first medium, instructing the first medium controller for controlling the first medium to directly transfer the data.

According to another nineteenth embodiment of the present invention, there is provided a method of controlling a storage controller, the method further including selecting data to be destaged so as to average the number of writing times on the first media.

What is claimed is:

1. A storage system for storing data from a computer into a medium, via a network, comprising:
 a storage controller, wherein the storage controller comprises:
 a channel controller coupled to the network,
 a cache memory that temporarily stores data related to a plurality of mediums, and a medium controller for each of the plurality of mediums,
 wherein each medium controller controls a corresponding one of the plurality of mediums,
 wherein the plurality of mediums includes a first medium having a restriction on a number of writing times,
 wherein the storage controller selects data to be destaged so as to average the number of writing times on the first medium; and
 wherein the storage controller records a number of destages on each of the first medium, and compares a number of destages on each of the first medium when selecting data to be destaged, and determines data to be destaged from data having a smaller number of destages with priority.

2. The storage system according to claim 1, wherein the storage controller records information on access time and frequency of data to be stored in each of the first media in relation to each of the first media.

3. The storage system according to claim 1, wherein the storage controller calculates an evaluation function based on a number of destages and access time on each of the first media, and determines data to be destaged from the data having a smaller value of the evaluation function with priority.

* * * * *